United States Patent [19]

Burrus, Jr. et al.

[11] Patent Number: 4,689,125
[45] Date of Patent: Aug. 25, 1987

[54] FABRICATION OF CLEAVED SEMICONDUCTOR LASERS

[75] Inventors: Charles A. Burrus, Jr., Fair Haven; Paul A. Kohl, Chatham; Tien P. Lee, Holmdel; Frederick W. Ostermayer, Jr., Chatham, all of N.J.

[73] Assignee: American Telephone & Telegraph Co., AT&T Bell Labs, Murray Hill, N.J.

[21] Appl. No.: 869,802

[22] Filed: May 28, 1986

Related U.S. Application Data

[63] Continuation of Ser. No. 416,494, Sep. 10, 1982, abandoned.

[51] Int. Cl.$^4$ ............................................. C25F 3/12
[52] U.S. Cl. ........................... 204/129.3; 204/129.55; 204/129.75
[58] Field of Search ............. 204/129.3, 129.55, 129.2, 204/129.75, 129.65, 325

[56] References Cited

U.S. PATENT DOCUMENTS

| | | | |
|---|---|---|---|
| 3,265,599 | 8/1966 | Soonpaa | 204/129.3 |
| 3,758,875 | 9/1982 | Hayashi | 331/94.5 |
| 4,096,619 | 6/1978 | Cook, Jr. | 29/413 |
| 4,184,171 | 1/1980 | Panish | 357/18 |
| 4,236,296 | 12/1980 | Woolhouse et al. | 29/569 |
| 4,237,601 | 12/1980 | Woolhouse et al. | 29/583 |
| 4,303,482 | 12/1981 | Böhne et al. | 204/129.3 |
| 4,351,706 | 9/1982 | Chappell et al. | 204/129.3 |
| 4,369,099 | 1/1983 | Kohl et al. | 204/129.3 |
| 4,386,142 | 5/1983 | Hodes et al. | 429/111 |
| 4,389,291 | 6/1983 | Kohl et al. | 204/129.3 |
| 4,391,683 | 7/1983 | Buckley et al. | 204/129.3 |
| 4,404,072 | 9/1983 | Kohl et al. | 204/129.3 |
| 4,409,075 | 10/1983 | Kolbesen | 204/129.3 |
| 4,414,066 | 11/1983 | Forrest et al. | 204/129.3 |
| 4,415,414 | 11/1983 | Burton et al. | 204/129.3 |
| 4,482,442 | 11/1984 | Kohl et al. | 204/129.3 |

FOREIGN PATENT DOCUMENTS

| | | | |
|---|---|---|---|
| 611774 | 1/1961 | Canada | 204/34.5 |
| 1193335 | 5/1965 | Fed. Rep. of Germany | 204/129.3 |
| 2382523 | 11/1978 | France | 204/129.3 |
| 190758 | 12/1966 | U.S.S.R. | 204/129.65 |

OTHER PUBLICATIONS

Applied Physics Letters, 40(4), 289 (1982), Blauvelt et al.
Electronics Letters 18, No. 5, 189 (1982), O. Wade et al.
IEEE Journal of Quantum Electronics, vol. QE-18, No. 7, Jul. 1982, T. P. Lee et al.

*Primary Examiner*—Donald R. Valentine
*Attorney, Agent, or Firm*—Walter G. Nilsen

[57] ABSTRACT

A process is described for making semiconductor lasers with cleaved facets for end mirrors. The process involves electrochemically photoetching slots with deep, narrow cross-sections in a wafer and applying stress to cleave the wafer in the desired place. Extremely short and reproducible semiconductor lasers can be made by this procedure (less than 50 or even 25 μm) which yields extremely useful semiconductor lasers particularly for communication applications. Also, the procedure requires a minimum of skill to produce excellent quality cleaved semiconductor lasers (including short-length lasers) with high yields.

15 Claims, 2 Drawing Figures

FABRICATION OF CLEAVED SEMICONDUCTOR LASERS

This application is a continuation of application Ser. No. 416,494, filed Sept. 10, 1982 now abandoned.

TECHNICAL FIELD

The invention is a process for making semiconductor lasers.

BACKGROUND OF THE INVENTION

The development of semiconductor lasers in the past number of years has lead to a device of great reliability and usefulness. A useful reference for the properties of semiconductor lasers is Heterostructure Lasers by H. C. Casey, Jr., and M. B. Panish Academic Press, Inc., New York, 1978 Part A and B. Also useful as a background reference is U.S. Pat. No. 3,758,875 issued to Izuo Hayashi on Sept. 11, 1973 and U.S. Pat. No. 4,184,171 issued to Morton B. Panish on Jan. 15, 1980.

It has been found after extensive investigations that cleaved laser facets either with or without fabricated mirrors (such as evaporated metal mirrors or dielectric mirrors) yield the lowest thresholds and most reproducible device performance. A number of techniques are available for cleaving facets on semiconductor lasers including, for example, mechanically scribing marks on the semiconductor laser material and then cleaving the semiconductor material along the scribe marks. Another technique, called the micro-cleaving technique, is also used. Here, certain materials that form part of the supporting structure of the active part of the semiconductor laser is etched away and then the semiconducting material cleaved to produce the laser mirrors (See H. Blauvelt et al, *Appl. Phys. Lett.* 40 (4), 289 (1982) and O. Wade et al, *Electronics Letters* 18, No. 5, 189 (1982)).

It is highly desirable to have a procedure for accurately and reliably cleaving semiconductor laser crystals which is easily and rapidly applied in a manufacturing atmosphere. It is particularly desirable to be able to accomplish this on the entire array of semiconductor laser crystals on a semiconductor wafer. Ease and accuracy in producing scribe marks for cleaving as well as simultaneous application to a large array of laser structures (as on a semiconductor wafer) are of primary concern.

In addition, it is highly desirable for some applications to have the cavity length of semiconductor lasers very short. Shorter cavity lengths yield a longitudinal mode structure which is more spread out in frequency units (greater separation in modes in frequency units) so that single longitudinal mode operation is more easily achieved. More stable single mode operation is possible with shorter cavity length (See for example T. P. Lee et al, *IEEE J. of Quantum Electronics*, Vol. QE-18, No. 7, July 1982). Also, lower threshold currents are obtained with shorter cavity lengths down to cavity lengths in the range from 50-100 micrometers (see C. A. Burrus et al, *Electronic Letters* 17, 954-956 (1981)). Often, attempting to cleave laser crystals closer than the thickness of the semiconductor wafer proves very difficult, especially to obtain consistently reliable results with high yields.

For the above reasons, it is highly desirable to develop a fabrication procedure for making semiconductor lasers with cleaved mirrors with very short cavity lengths. Although the technique should be applicable to semiconductor lasers of any length, it should also give reliable results to cavity lengths less than 100 micrometers or even 50 micrometers or even 25 micrometers. Particularly desirable is a procedure which yields such laser structures with high reliability and high yield.

SUMMARY OF THE INVENTION

The invention is a process for making a semiconductor laser in which individual facets of the laser are cleaved by first etching preferably deep, narrow slots or V-grooves on the back of the laser wafer by a electrochemical photoetching procedure and subjecting the wafer to stress to achieve the crystal cleavage. Particularly important is the electrochemical photoetching procedure since it produces deep, narrow slots or V-grooves which makes possible precise location of the cleavage. Other shapes may be used to assist in the cleavage including holes (away from the active area of the laser), but deep narrow slots or V-grooves seem most convenient and works best.

The parameter of interest as far as etched depth is concerned is that the thickness of the unetched part of the wafer (distance from bottom of etched groove to opposite face of wafer) is less than the separation between cleaved surfaces. Ease and reliability in cleaving the wafer becomes greater the less the unetched wafer thickness.

The etching procedure is useful for n-type and intrinsic compound semiconductor material. It involves the following procedure:

a. illumination of the surface to be etched on the compound semiconductor with radiation of sufficient energy to produce holes in the valence band;

b. exposure of the compound semiconductor to an electrolyte solution which is sufficiently conductive to allow reasonable oxidation-reduction rates (generally greater than 0.0001 mhos/cm) and which will remove the oxidation products of the etching procedure; and c. making the compound semiconductor part of an oxidation-reduction electrochemical process with a potential applied to the compound semiconductor relative to a standard electrode that is between the maximum potential of the valence band and the minimum potential of the conduction band of the compound semiconductor in the electrolytic solution.

Such a procedure rapidly produces straight-walled slots or V-grooves typically from 1-10 micrometers wide and 50-100 micrometers deep. Particularly significant is the directional quality of the etch procedure which produces deep narrow slots. Such an etched structure minimizes the amount of area lost (so that individual laser structures can be closer together on the wafer or cavity lengths can be smaller) but the depth of etching makes cleaving easier and more reliable. By exposing the wafers to stress, (preferably in such a way as to initiate cleavage in the active area of the laser structure) cleavage of the semiconductor material in the active area is achieved. Very short lasers, typically shorter than 100 micrometers, 50 micrometers, or even 25 micrometers can be made routinely with excellent laser properties such as low threshold, wide mode structure, etc. This procedure is useful for batch quantities, is not tedious and does not require highly precise, skilled application by an operator.

DETAILED DESCRIPTION

Figure 1:
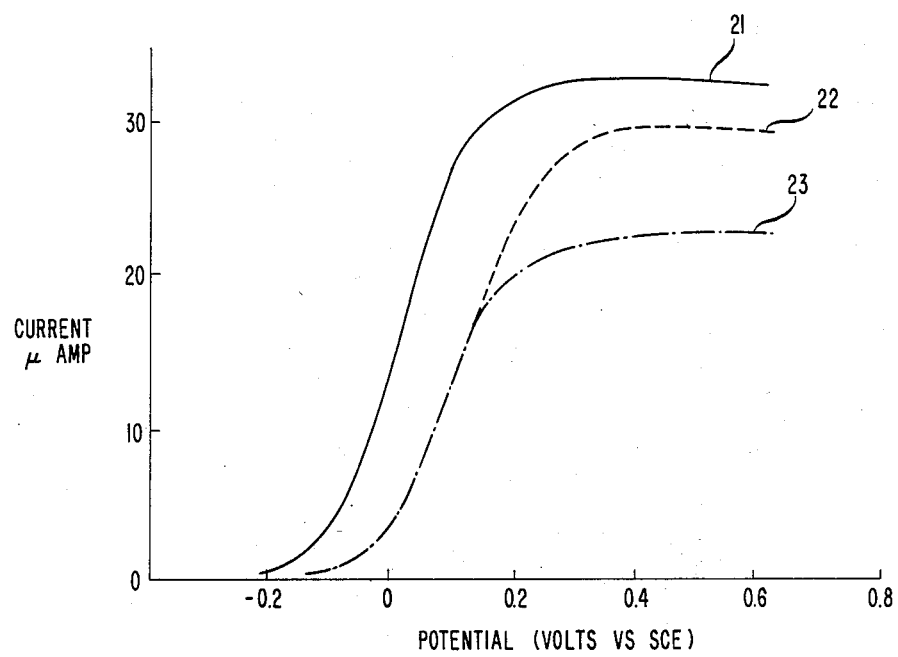
FIG. 1 is a voltammogram of n-type InP.

The invention, to a large degree, depends on the observation that particularly deep, narrow etch structures (i.e., slots, V-grooves, etc.) can be etched in certain kinds of semiconductor material and that these grooves would be suitable for initiating cleavage along crystalline planes in compound semiconductor laser structures. These grooves are made by an electrochemical photoetching procedure and may be of various shapes including square-walled, V-grooved, or rounded-bottomed but generally have the characteristics of being relatively deep and narrow. Generally, these grooves are produced on the backface of the laser structure (on the substrate and not near the active region of the laser) and the wafer flexed or put under strain to affect cleavage at the end faces of the semiconductor laser. Also for convenience, the same general procedure is used to affect cleavage on the side of the laser structure.

Particularly important is the electrochemical photoetching procedure used to produce the grooves in the laser substrate. The procedure is useful for a certain class of semiconductors, namely compound semiconductors including III-V compounds and II-VI compound semiconductors. Typical compound semiconductors to which the photoetching procedure can be applied are CdS, CdSe, HgCdTe, GaP, GaAs, AlAs, AlP, AlSb, InSb, InAs, InP, GaInAs, GaInP, GaInAsP, GaAlP, and GaAlAs. Both intrinsic and n-type material may be etched by the inventive process. Intrinsic semiconductors refers to a class of semiconductors where the number of holes and electrons are nearly equal (usually within a factor of 100).

Intrinsic semiconductors include undoped semiconductors and compensated semiconductors (semiconductors doped with traps to compensate for impurities or other dopants). Typically, such semiconductors are semi-insulating with resistivities greater than $10^6$ ohm-cm. Often, such materials are useful for substrates because of their semi-insulating characteristics. Resistivities greater than $10^7$ ohm-cm or even $10^8$ ohm-cm are used.

Also included are n-type compound semiconductors where electrons exceed holes. Usually n-type semiconductors are obtained by doping with donors (i.e., sulfur, selenium or tellurium) for group V elements or silicon or group III elements. Typical doping levels are $10^{15}$ to $10^{19}$ atoms per cubic centimeter, with $10^{16}$ to $10^{18}$ atoms per cubic centimeter preferred for many applications.

For convenience, the etching process may be described in three parts: the electrochemical part, the irradiation part, and the nature of the electrolytic solution used in the process.

In broad terms, the compound semiconductor to be etched is made part of an oxidation-reduction electrochemical process with the compound semiconductor made the anode and an inert material made the counter-electrode or cathode. Typically, the cathode is an inert metal such as platinum or platinized titanium although a wide variety of materials may be used.

A power supply (battery or electronic power supply) is used to adjust the potential on the compound semiconductor to a range to be discussed below and to supply power for the oxidation-reduction reaction. In addition, a standard electrode (usually a saturated KCl calomel electrode, SCE) is used to measure the potential on the compound semiconductor. Potential is typically measured with a voltmeter, current (which is proportional to etch rate) is measured with an ammeter.

Particularly critical is the potential applied to the compound semiconductor in the electrochemical photoetching procedure. Too high a potential leads to excessive etching in the absence of light so that the etching procedure essentially becomes an isotropic process. In this case, the desirable geometrical shape which s to be etched will not be obtained. Too low a potential will yield excessively low etch rate or no etching at all. As a general criteria, the potential applied to the compound semiconductor should be between the maximum potential of the valence band of the compound semiconductor in the electrochemical solution being used and the minimum potential of the conduction band of the compound semiconductor under the same conditions.

In the case of intrinsic semiconductors, the potential range should be between the valence band maximum and the flat band potential—often located halfway between valence band maximum and conduction band minimum. However, the flat band potential can be changed (by minute dopings, surface effects, etc.) and the wider potential range seems more appropriate. It should be recognized that these two potentials (valence band maximum and conduction band minimum), depend on the particular compound semiconductor being etched, the kind and amount of doping in the compound semiconductor and on the nature and composition of the electrolytic solution being used. Often these various potentials can be estimated or obtained directly from data in the literature but more often it is advantageous to measure the quantities directly using a voltammogram in the actual electrolytic solution to be used in the etching process. In a voltammogram, the current in a typical electrochemical setup described above is measured as a function of the potential applied to the compound semiconductor. This is done both with and without radiation. It is found that in one region of potential, there are high etching rates (as evidenced by high currents) with radiation and essentially no etching (near zero current) without radiation. It is this region of potential which is of interest in the electrochemical photoetching process. The potential where current increases without radiation is positive of the potential of the valence band maximum; the potential where this occurs with radiation is positive of the potential of the conduction band minimum. This potential is the flat band potential. For intrinsic material, this is usually located halfway between valence band maximum and conduction band minimum. For n-type material, it is located near the conduction band minimum.

A typical voltammogram with radiation from a helium-neon laser (wavelength 6328 Angstroms) is shown in FIG. 1. These measurements were carried out on three orientations of n-type InP using a helium-neon laser for radiation. The doping density was approximately $10^{16}$ atoms per cc. The measurements were carried out in a one molar hydrochloric acid solution. The laser power was approximately 110 microwatts. The different curves apply to different crystalline orientations, namely curve 21 to etching on the (100) face, curve 22 to etching on the (111) face and curve 23 to etching on the ($\bar{1}\bar{1}\bar{1}$) face. Only the part of the voltammogram with radiation is shown. Without radiation, the onset of current (therefore etching) is displaced toward more positive potential by about 1.4 volts. As can be seen, as the potential increases from approximately −0.2 volts, the current increases and reaches a maximum at approximately 0.2 volts. The current is a measure of the rate of electrochemical photoetching. It should be noted that the amount of current (etching rate) at the plateau maximum does not depend on potential but is only proportioned to the light intensity incident on the compound semiconductor. It is this property of the electrochemical photoetching process that makes possible the production of a large variety of geometrical shapes on compound semiconductors. Similar curves to the one shown in FIG. 1 are obtained in aqueous HF solution, aqueous HBr solution and with other compound semiconductors such as GaAs and GaAlAs. Etching in the absence of radiation for n-type InP generally occurs at about +1.0 volts. Usually the electrochemical photoetching process is best carried out at a voltage on the flat portion of the voltammogram but far away from where etching takes place without the radiation. For example, for n-type-InP, this is at a potential of approximately +0.2 volts. Here, the advantages of etching without any sensitivity to potential are obtained and the amount of etching in the absence of radiation is minimized. Put in another way, the etching is most sensitive to radiation intensity and least sensitive to applied potential.

For n-type GaAs, the potential in one molar HCl ranges from about −0.7 to +1.0 with −0.4 to +0.4 preferred and 0.0 volts (on the SCE scale) best for most etching procedures. For GaAlAs, the conduction band can be more negative by up to 0.4 volts (depending on aluminum concentration) without much change in the valence band so that a range from about −1.1 to +1.0 gives satisfactory results. Preferred range is −0.8 to +0.4.

For n-type InP, the potential on the SCE scale is between −0.5 and 1.0 volts with −0.1 to 0.5 volts preferred.

Irradiation is used to create holes in the valence band. Generally, the energy of the radiation should be great enough to accomplish this. Theoretically, the photon energy of the radiation should be at least as great as the band gap of the semiconductor. In some cases, less energy can be used because of occupied states (due to impurities, doping elements, compensation elements, crystal imperfections, etc.) in the band gap. However, the process is most easily and rapidly carried out with radiation of energy greater than the band gap of the compound semiconductor. Both broad-band and monochromatic radiation may be used.

A particular advantage of the process is that the rate of etching is proportional to the light intensity. Thus, various geometrical shapes may be etched by suitable light intensity distribution and light-ray direction.

A few examples might serve to illustrate the importance of this aspect of the invention. To etch deep slots in a compound semiconductor, a mask is applied to the compound semiconductor to limit radiation to where the slots are wanted. Paralleled ray radiation (collimated light) is used to insure straight-walled etching. If a V-groove slot is wanted, the light rays are focused onto a line along the slot, with the line of focus at the bottom of the V-groove. An upside-down cone shape might require radiation focused to a point at the apex of the cone.

A particularly important part of the invention is the nature and composition of the electrolytic solution. A general requirement for the electrolytic solution is that it be sufficiently conductive to permit reasonable electrochemical photoetch rates. Generally, a conductivity greater than 0.0001 mhos/cm is sufficient to meet this requirement. Although this requirement may be met by the introduction of ionized salts such as potassium nitrate, etc., it is usually met by the presence of other chemicals used to remove the oxidation products of the compound semiconductor being etched.

Another requirement easily stated but less easily put in practice is that the electrolytic solution should not interfere in a detrimental way with the oxidation-reduction electrochemical reaction or the irradiation procedure. Generally, this indicates that the components of the electrolytic solution not be subject to oxidation or reduction at the potentials at any of the electrodes and not be opaque (i.e., not excessively absorb) to the radiation used in the process. Under special conditions, it might be convenient or advantageous to introduce a mild oxidizing agent to the electrolytic solution so that reduction at the cathode takes place more easily. A similar situation might be obtained for a mild reducing agent but for the most part stability to the electrochemical conditions at the anode (semiconducting material) and cathode (counter-electrode) is preferred. In general, the reduction at the cathode involves the reduction of water to form hydrogen gas.

For example, a number of acids might be used in the practice of the invention but generally the acids $HNO_3$ and HI would be avoided because of the possibility of reducing $HNO_3$ or oxidizing HI.

The most critical requirement of the electrolytic solution is that it removes the oxidation products of the photoetching process rapidly and in such a way as to not limit the etching rate. High solubility of these oxidation products is preferred. Both acids and bases may be used to accomplish this end, generally with pH values less than 5 or greater than 9. Preferably, the pH should be less than 3 or greater than 11. The alkaline solutions are usually made by the addition of alkaline agents such as sodium hydroxide or potassium hydroxide. Chelating agents may also be useful in insuring rapid removal of the oxidation products of the etching procedure.

It has been found that the halogen acids HF, HCl, and HBr yield best results. These acids not only produce rapid etching but are also extremely stable at the potentials used in the electrochemical photoetching procedure. Sulfuric acid solutions also yield excellent results with some compound semiconductors (i.e., GaAs) but should usually be avoided with compound semiconductors containing indium (i.e., InP).

The concentration of acid may vary over wide limits including from about 0.05 molar to 10 molar but best results are usually obtained in the range from 0.2 to 2.0 molar. In addition, for the most part, hydrochloric acid is preferred because of its stability, rapid etching, and the minimum damage obtained in the fabrication of optical devices. In general, the etching rate may vary over wide limits but generally rates between 1 and 150 milliampere per square centimeter yield excellent results.

The procedure described above is used to etch slots or grooves in a wafer to cleave the structure to produce individual cleaved laser structures from a semiconductor wafer. The procedure will be illustrated on a GaAs laser but any type of laser made of either n-type or intrinsic compound semiconductor may be made using the inventive process.

The invention in its broadest aspects involves using the electrochemical photoetching procedure described above to etch various geometrical features in the substrate of the laser wafer or even in the layer structure but away from the active portion of the laser to assist in cleaving the structure so as to produce a cleaved mirror face. Usually slots or grooves are used, but holes through the structure away from where radiation comes out, may also be used.

Figure 2:
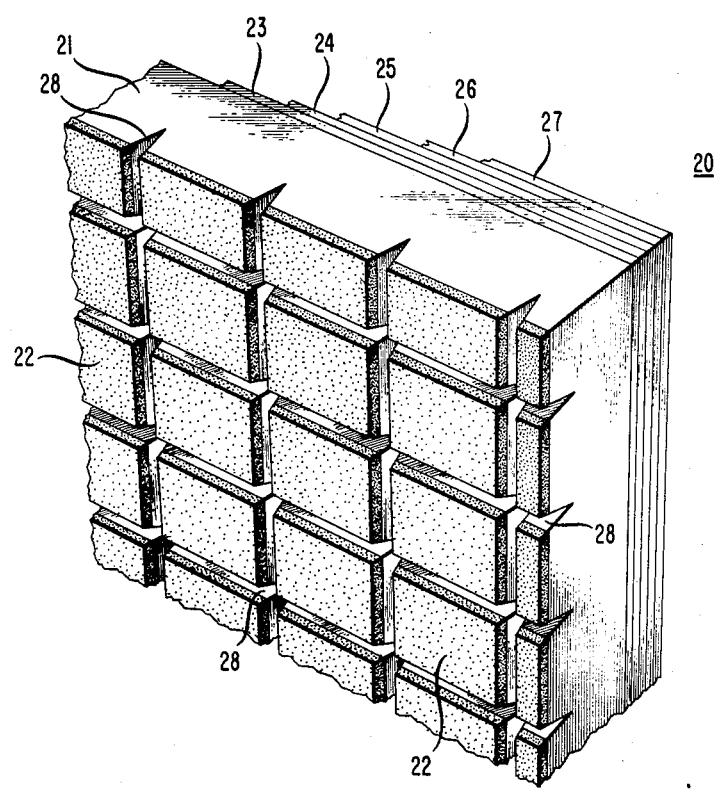
FIG. 2 shows a perspective view of a semiconductor wafer with individual laser crystals before separation and V-grooves etched in the wafer to effect cleaving.

FIG. 2 shows part of a typical wafer 20 with the individual lasers before cleaving. The structure of the wafer is typical for purposes of illustrating the invention. The wafer is made up of a substrate 21 made of n-type GaAs usually doped with silicon to the extent of about $10^{17}$–$10^{18}$ atoms per cc. The substrate is capped with metal (generally gold) contacts 22 which also act as the masks for the photoetching process where an etched channel is desired. On the other surface of the substrate is located, in order, the following layers generally put on by liquid phase epitaxy: an n-type layer 23 of $Ga_{0.64}Al_{0.36}As$, a p-type layer 24 of $Ga_{0.92}Al_{0.08}As$, a p-type layer 25 of $Ga_{0.64}Al_{0.36}As$ and a p-type layer 26 of GaAs. This last layer is capped by a metallic layer (generally gold or gold alloy) 27 which eventually becomes a metallic contact. The grooves 28 are etched as follows: first, the wafer as shown in FIG. 2 but without the grooves is immersed in an electrolytic solution comprising 1.0 molar hydrochloric acid. The wafer is made the anode in an electrolytic setup by electrically connecting a power supply to one of the metallic layers in the wafer structure. A piece of platinum is made the cathode in this setup and a saturated calomel cell is used as a potential standard. The power supply is used so that a potential of approximately 0.0 volts (on the SCE scale) is impressed on the semiconductor wafer. A broad-band tungsten light source was used as a source of radiation and various lenses were used to insure focusing of the light between the metal electrode to insure that a V-groove was etched. A V-groove can be obtained by using a variable-transmission mask with highest intensity where the groove is deepest or defocusing a slotted mask. Etching was carried out for a period of approximately 2 hours to produce V-grooves much as shown in FIG. 2.

Since cleaved surfaces are only required at the front and back of the semiconductor lasers, V-grooves need only be produced in one direction. Along the side of the laser an ordinary saw-cut may be used. However, it is often just as convenient to produce the V-groove in accordance with the invention along both directions. Similar results are obtained using InP type laser structures except that in this case a somewhat different potential (usually 0.2 volts) is used.

Other structural features may also be used either separately or in connection with the V-groove to affect cleaving in the desired area. Square-walled grooves may be used as well as a round-bottomed groove. Also cleavage may be put on the other side of the wafer provided care is used to avoid the active region of the laser. Holes may be used that go through the entire wafer structure or partly through the wafer structure provided etching is not carried out in the active region of the laser.

Cleaving may be carried out in a variety of ways well-known in the art. Generally, this is done by providing stress along the grooves as, for example, by flexing the wafer. It has been found highly advantageous to initiate cleavage close to the active region of the laser. Semiconductor lasers made by initiating the cleavage in or close to the active area show preferred properties such as low thresholds, high power, better quality mirrors. For this reason it is preferred that the cleavage be initiated on the end of the wafer containing the epitaxial layers. Thus, the cleavage should be achieved by forcing the walls of the grooves or channels toward one another.

What is claimed is:

1. A process for producing a semiconductor laser by cleaving a wafer comprising n-type InP compound semiconductors so that part of the cleaved surface is in the active area of the semiconductor laser comprising the steps of first etching a portion of the n-type InP compound semiconductor in an electrolytic solution, said electrolytic solution comprising HCl and then producing stress on the wafer to produce the cleaved surface characterized in that the etching procedure is an electrochemical photoetching procedure carried out by:
   a. applying a potential to the n-type InP semiconducting compound which is between $-0.5$ and 1.0 volts on the SCE scale;
   b. illuminating the part of the surface of the n-type InP compound semiconductor to be etched with radiation of sufficient energy to produce holes in the valence band.

2. The process of claim 1 in which the etching procedure produces a narrow slot.

3. The process of claim 2 in which the narrow slot is from 1–10 $\mu$m wide and 50–100 $\mu$m deep.

4. The process of claim 1 in which the etching procedure produces a V-groove.

5. The process of claim 4 in which the V-groove is from 1–10 $\mu$m wide at its maximum width and 50–100 $\mu$m deep.

6. The process of claim 1 in which the stress is such that cleavage occurs first near the active area of the semiconductor laser.

7. The process of claim 1 in which the compound semiconductor is n-type InP, said n-type InP includes a (100) face and the potential for the (100) face on the SCE scale is between $-0.5$ and 1.0 volts in one molar HCl.

8. The process of claim 7 in which the potential range is from $-0.1$ and 0.5 volts.

9. The process of claim 1 in which the pH of the electrolytic solution is less than 5.

10. The process of claim 9 in which the pH is less than 3.

11. The process of claim 1 in which the acid concentration varies from about 0.05 to 10 molar.

12. The process of claim 11 in which the concentration range of the acid is between 0.2 and 2.0 molar.

13. The process of claim 1 in which the electrolytic solution contains salts to improve conductivity.

14. The process of claim 1 in which the doping level is between $10^{15}$ and $10^{19}$ atoms per cubic centimeter.

15. The process of claim 1 in which the energy of the radiation s greater than the band gap of the compound semiconductor.

* * * * *